(12) United States Patent
Brandt et al.

(10) Patent No.: US 12,063,004 B2
(45) Date of Patent: Aug. 13, 2024

(54) METHOD FOR MONITORING THE OPERATION OF A FREQUENCY CONVERTER, AND FREQUENCY CONVERTER

(71) Applicant: Lenze SE, Aerzen (DE)

(72) Inventors: Johannes Brandt, Kreuzlingen (CH); Torsten Wedemeyer, Aerzen (DE); Thomas Bisig, Romanshorn (CH)

(73) Assignee: Lenze SE, Aerzen (DE)

( * ) Notice: Subject to any disclaimer, the term of this patent is extended or adjusted under 35 U.S.C. 154(b) by 571 days.

(21) Appl. No.: 17/298,346

(22) PCT Filed: Nov. 26, 2019

(86) PCT No.: PCT/EP2019/082613
§ 371 (c)(1),
(2) Date: Feb. 2, 2022

(87) PCT Pub. No.: WO2020/109321
PCT Pub. Date: Jun. 4, 2020

(65) Prior Publication Data
US 2022/0247339 A1 Aug. 4, 2022

(30) Foreign Application Priority Data
Nov. 30, 2018 (DE) ...................... 10 2018 220 769.0

(51) Int. Cl.
*H02P 6/06* (2006.01)
*G01R 25/00* (2006.01)
(Continued)

(52) U.S. Cl.
CPC .......... *H02P 29/024* (2013.01); *G01R 25/005* (2013.01); *G01R 31/343* (2013.01); *H02P 23/26* (2016.02); *H02P 27/085* (2013.01)

(58) Field of Classification Search
CPC ...... H02P 29/024; H02P 23/26; H02P 27/085; G01R 25/005; G01R 31/343
See application file for complete search history.

(56) References Cited

U.S. PATENT DOCUMENTS

| 6,396,229 B1 | 5/2002 | Sakamoto et al. |
| 10,346,264 B2 | 7/2019 | Bisig |
| 2017/0357556 A1 | 12/2017 | Bisig |

FOREIGN PATENT DOCUMENTS

| CN | 103078520 A | 5/2013 |
| CN | 106877291 A | 6/2017 |

(Continued)

OTHER PUBLICATIONS

International Search Report (PCT/ISA/210) issued in PCT Application No. PCT/EP2019/082613 dated Jan. 31, 2020 with English translation (five (5) pages).

*Primary Examiner* — Karen Masih
(74) *Attorney, Agent, or Firm* — Crowell & Moring LLP

(57) ABSTRACT

A method for monitoring the operation of a frequency converter (1), which is designed to drive an electric motor (2), wherein the method comprises the following steps:
generating phase voltages (u1, u2, u3) for corresponding phase sections (2.1, 2.2, 2.3) of the electric motor (2),
ascertaining a voltage rotating field,
measuring occurring phase currents (i1, i2, i3), ascertaining a current rotating field depending on the measured phase currents (i1, i2, i3),
calculating a phase difference between the voltage rotating field and the current rotating field and/or calculating a frequency difference between the frequency of the voltage rotating field and the frequency of the current rotating field, and (Continued)

determining a fault state when the phase difference exceeds a phase difference threshold value and/or when the frequency difference exceeds a frequency difference threshold value.

3 Claims, 2 Drawing Sheets

(51) Int. Cl.
*G01R 31/34* (2020.01)
*H02P 23/26* (2016.01)
*H02P 27/08* (2006.01)
*H02P 29/024* (2016.01)

(56) References Cited

FOREIGN PATENT DOCUMENTS

| | | | |
|---|---|---|---|
| CN | 206283242 U | | 6/2017 |
| CN | 107112910 A | | 8/2017 |
| CN | 113965139 A | * | 1/2022 |
| DE | 10 2011 009 927 A1 | | 8/2012 |
| DE | 10 2011 009 932 A1 | | 8/2012 |
| DE | 10 2015 000 986 A1 | | 7/2016 |
| DE | 10 2015 200 190 A1 | | 7/2016 |

* cited by examiner

METHOD FOR MONITORING THE OPERATION OF A FREQUENCY CONVERTER, AND FREQUENCY CONVERTER

BACKGROUND AND SUMMARY OF THE INVENTION

The invention relates to a method for monitoring the operation of a frequency converter and to a frequency converter.

The invention is based on the object of providing a method for monitoring the operation of a frequency converter and a frequency converter that make it possible to monitor the operation in a reliable and cost-effective manner.

The invention achieves this object by way of a method for monitoring the operation of a frequency converter and a frequency converter according to the independent claims.

The method is used to monitor the operation of a frequency converter, which is designed to drive an electric motor. The electric motor can be a synchronous motor or an asynchronous motor, for example.

In the method, phase voltages for corresponding phase sections or between corresponding phase sections of the electric motor are conventionally generated based on associated setpoint values for the phase voltages. Amplitude and frequency of the phase voltages are generated, for example, in a manner based on setpoint values in such a way that a desired rotational speed of the electric motor and/or a desired torque of the electric motor is produced. Three phase voltages for three corresponding phase sections are typically generated. Reference should also be made in this respect to the relevant technical literature.

A voltage rotating field is ascertained as a further method step. In particular, the voltage rotating field is calculated depending on the setpoint values for the phase voltages. Reference should also be made to the relevant technical literature with respect to the ascertaining of the voltage rotating field.

At least one phase current, which flows in a phase section and which arises due to the phase voltages, is measured as a further method step. In the case of a three-phase electric motor, it may be sufficient to measure two of the three phase currents, since the third phase current results by way of calculation from the other two phase currents.

A current rotating field is calculated depending on the measured phase current or currents as a further method step. Reference should also be made in this respect to the relevant technical literature.

A phase difference between the voltage rotating field and the current rotating field and/or a frequency difference between the frequency of the voltage rotating field and the frequency of the current rotating field is/are calculated as a further method step.

Finally, a fault state is determined when the phase difference or a magnitude of the phase difference exceeds a phase difference threshold value and/or when the frequency difference or a magnitude of the frequency difference exceeds a frequency difference threshold value.

The phase difference threshold value and the frequency difference threshold value can be absolute or relative values. The phase difference threshold value and the frequency difference threshold value can take into account a possible slip. The phase difference threshold value and the frequency difference threshold value can lie, for example, in a range between 1% and 10% based on a phase of the voltage rotating field or based on a frequency of the voltage rotating field.

The position of a rotor of the electric motor is typically ascertained in applications with safety functions by means of what is known as a secure encoder system. By means of such an encoder system, it is possible to determine the rotational speed and the angular position of the rotor. However, the encoder system constitutes a space and cost factor. Therefore, it is usual to omit such encoder systems in cost-critical installations. However, this involves restrictions in dynamics and accuracy, but this is acceptable in many applications.

Conventional synchronous or asynchronous motors are driven using a three-phase voltage rotating field, wherein the phase sections are denoted by 2.1, 2.2, 2.3 in the following figures (also conventionally denoted by U, V and W). The angular velocity ω_mech of the rotor depends on the angular velocity ω_el or rotational frequency f of the feeding voltage rotating field. A phase current i1, i2, i3 is generated in each of the three phase sections 2.1, 2.2, 2.3 by way of the voltage rotating field. For the angular velocity w_el, $\omega\_el = 2\pi f$ applies.

In the case of synchronous motors, there is a strong proportionality between the angular velocity of the magnetic rotating field or voltage rotating field and the angular velocity of the rotor. In the case of asynchronous machines, the angular velocity of the magnetic rotating field or voltage rotating field during motor operation is always higher than the angular velocity of the rotor. The difference is described by the slip (s) and is necessary in order for the asynchronous machine to be able to apply a torque. In this case, the slip during motor operation is always between 0 and 1. The number of pole pairs (p) still has to be taken into account in the calculation of the mechanical rotational speed.

Therefore, the following applies to the synchronous machine:

$$\omega_{mech,SM} = \frac{2\pi f}{p}$$

in the case of the ASM, the slip still has to be supplemented.

$$\omega_{mech,ASM} = \frac{2\pi f}{p}(1-s)$$

In accordance with the invention, a secure encoder system is now omitted, wherein the frequency of the current rotating field and the frequency of the voltage rotating field are used to monitor the operation of the frequency converter, for example to monitor the angular velocity of the electric motor driven by means of the frequency converter.

The voltage rotating field describes the cycle of the voltage in the electric motor. In order to obtain the current orientation of the current vectors and the voltage vectors that describe the current rotating field and the voltage rotating field, respectively, the current voltage values and current values are each added geometrically.

$$\vec{x} = \sqrt{\frac{2}{3}} \left(1 \underline{a} \, \underline{a}^2\right) \begin{pmatrix} x_1 \\ x_2 \\ x_3 \end{pmatrix} \text{ with } \underline{a} = e^{j120°}$$

The value $\vec{\underline{x}}$ contains angle information as well as amplitude information. For the calculation of the rotational speed, only the derivation of the angle needs to be determined. Instead of the voltage, the duty cycles can also be used for the calculation of the angular velocity in the voltage rotating field. The duty cycles and the voltage differ only in amplitude, which in turn has no influence on the angular velocity.

In this case, the property that the current and the voltage (or the duty cycles) contain the rotating field frequency can be utilized and with both values it is possible to determine the speed of the rotor by disregarding the slip.

It is therefore possible to design a two-channel structure in order to monitor the angular velocity of the rotor. In this case, the voltage rotating field forms a first channel and the current rotating field forms a second channel.

After the fault state has been determined, the frequency converter can be disconnected, for example, based on the functions STO, SS1, SLS, SMS and SDI.

The invention constitutes a cost-effective solution for safety technology without an encoder, in particular for the functions SS1, SLS, SMS, SDI and SMS. Reliable detection of the output frequency is also possible even in asynchronous motors without additional sensor systems in the power output stage. The invention therefore makes it possible to implement rotational speed-related safety functions without an additional feedback system, in particular even in the case of asynchronous machines.

The output frequency, that is to say the rotational speed of the electric motor, can be monitored by independent evaluation of the phase angle of the current rotating field and voltage rotating field. The monitoring can take place on a communication channel between a control unit and a power unit, wherein the voltage rotating field or the associated voltage space vector is formed from setpoint values for the phase voltages from the control unit and the current rotating field or the associated current vector is formed from a measurement value of the phase currents from the power unit.

The two channel system necessary for safety reasons is achieved by virtue of two variables that are physically separate from one another, namely the angle of the voltage rotating field or voltage factor on the one hand and angle of the current rotating field or current vector on the other hand, being monitored.

There is the possibility that two monitoring units monitor the angles of the voltage and current vectors and introduce or maintain a safe state when the detected rotational speed is outside of predefined limits.

No feedback system at the motor is necessary for detecting the rotational speed. Costs in the system can be saved as a result.

In accordance with one embodiment, the voltage rotating field is ascertained depending on the setpoint values for the phase voltages. Reference should also be made in this respect to the relevant technical literature.

In accordance with one embodiment, the phase voltages for the corresponding phase sections of the electric motor are generated by means of pulse width modulation with varying duty cycles, wherein the voltage rotating field is ascertained depending on the duty cycles of the pulse width modulation. Reference should also be made in this respect to the relevant technical literature.

In accordance with one embodiment, after the fault state has been determined, fault handling is carried out, in particular the generation of the phase voltages and therefore also of the rotating field is suppressed.

In accordance with one embodiment, after the fault state has been determined, a safe torque off function is carried out.

In accordance with one embodiment, the frequency converter also comprises: a control unit, for example in the form of a microprocessor, a power unit and at least one safety unit, in particular precisely two safety units independent of one another. The power unit can conventionally comprise, for example, an inverter with power semiconductors etc., which is designed to generate the phase voltages. The control unit, the power unit and the at least one safety unit are coupled to one another for the purpose of data exchange via a communication channel. A respective setpoint value for the phase voltages is transmitted from the control unit via the communication channel to the power unit, wherein the power unit then generates the phase voltages according to the setpoint value or values. The measurement values relating to the measured phase currents are transmitted from the power unit via the communication channel to the control unit. The at least one safety unit is designed to evaluate the setpoint value or values for the phase voltages transmitted via the communication channel and the measurement values relating to the measured phase currents transmitted via the communication channel in order to determine the fault state.

The frequency converter according to the invention is designed to carry out the method described above.

In accordance with one embodiment, the frequency converter comprises: a control unit, for example in the form of a microprocessor, a power unit and at least one safety unit, in particular precisely two safety units independent of one another. The power unit can conventionally comprise, for example, an inverter with power semiconductors etc., which is designed to generate the phase voltages. The control unit, the power unit and the at least one safety unit are coupled to one another for the purpose of data exchange via a communication channel. A respective setpoint value for the phase voltages is transmitted from the control unit via the communication channel to the power unit, wherein the power unit then generates the phase voltages according to the setpoint value or values. The measurement values relating to the measured phase currents are transmitted from the power unit via the communication channel to the control unit. The at least one safety unit is designed to evaluate the setpoint value or values for the phase voltages transmitted via the communication channel and the measurement values relating to the measured phase currents transmitted via the communication channel in order to determine the fault state.

In accordance with one embodiment, the control unit is designed to regulate the phase currents.

In accordance with one embodiment, the control unit is designed to use the phase voltages as manipulated variable for the regulation of the phase currents.

The invention is described in detail below with reference to the drawings.

DETAILED DESCRIPTION OF THE DRAWINGS

Figure 1:
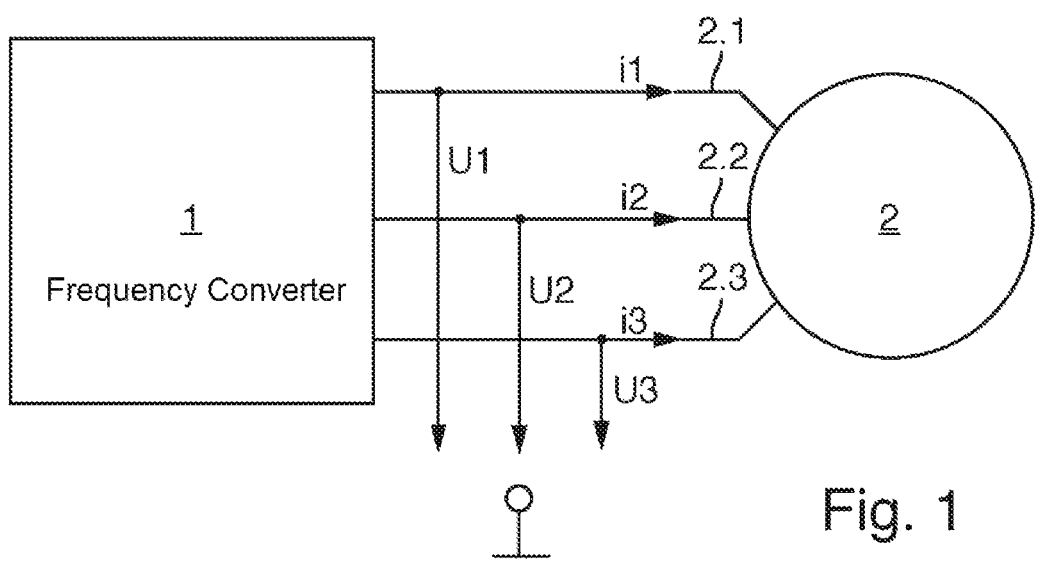
FIG. 1 highly schematically shows a drive system with a frequency converter and an electric motor driven by means of the frequency converter.

FIG. 1 highly schematically shows a drive system with a frequency converter 1 and an electric motor 2 driven by means of the frequency converter 1.

The frequency converter 1 is designed to generate three phase voltages u1, u2, u3 for corresponding phase sections 2.1, 2.2, 2.3 or between corresponding phase sections 2.1, 2.2, 2.3 of the electric motor 2 and to measure occurring phase currents i1, i2 and i3. Reference should also be made in this respect to the relevant technical literature.

Figure 2:
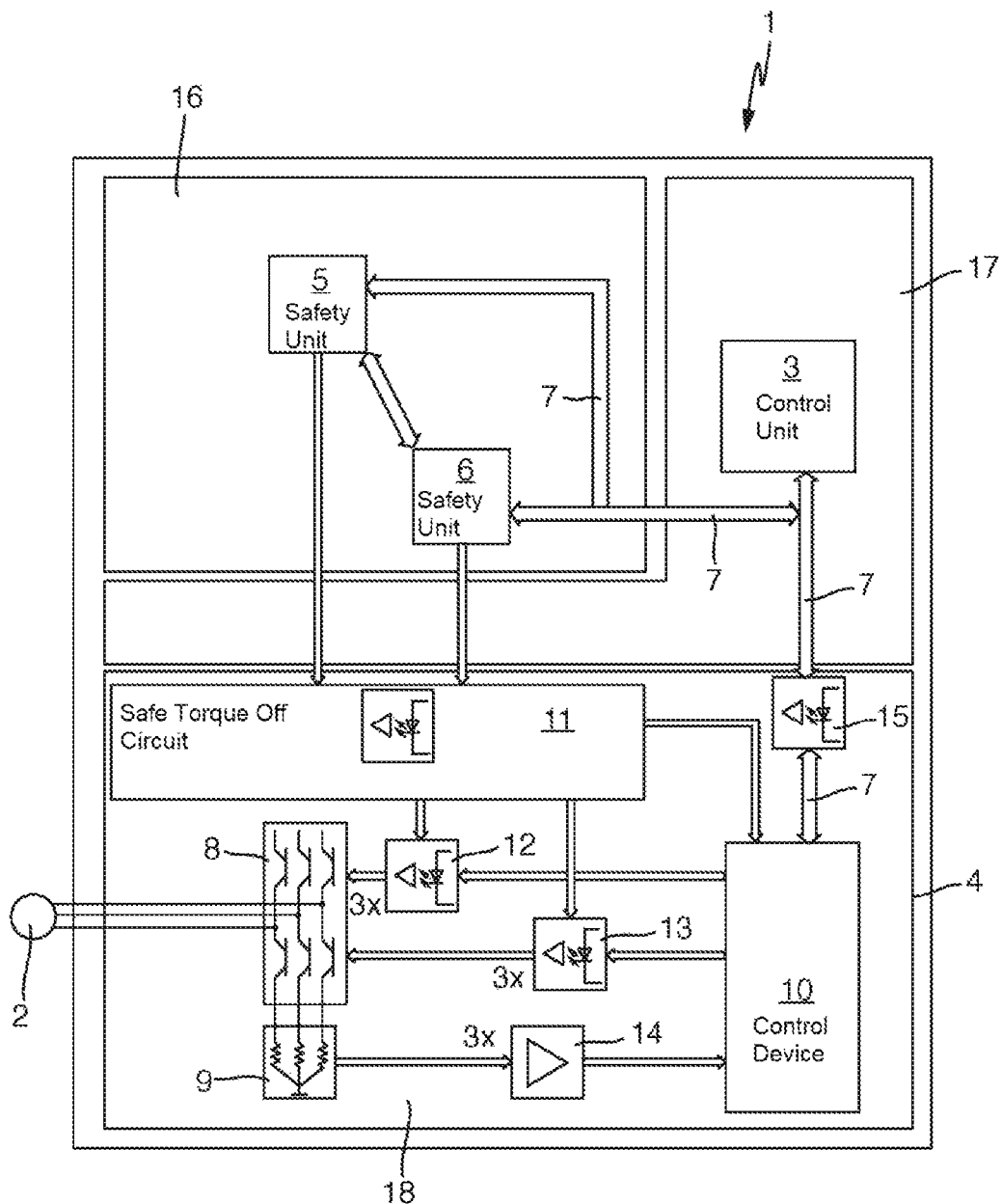
FIG. 2 is a schematic block diagram of an internal structure of the frequency converter shown in FIG. 1.

FIG. 2 shows a schematic block diagram of an internal structure of the frequency converter 1 shown in FIG. 1.

With reference to FIG. 2, the frequency converter 1 has a control unit 3, for example in the form of a microcontroller. The frequency converter 1 also comprises a power unit 4. The power unit 4 comprises a conventional inverter 8 for generating the phase voltages u1, u2 and u 3. The power unit 4 also comprises conventional current sensors 9, for example in the form of shunt resistors. The phase currents i1, i2 and i3 are measured by means of the current sensors 9. The power unit 4 also comprises a control device 10, which controls all essential functions of the power unit 4. The power unit 4 also comprises a safe torque off (STO) circuit 11, by means of which an STO state can be brought about. The inverter 8 is connected to the control device 10 via optocouplers 12 and 13. The current sensors 9 are connected to the control device 10 by means of an optional signal amplifier 14.

The frequency converter 1 also comprises a first safety unit 5 and a second safety unit 6.

The control unit 3, the power unit 4 (DC-isolated by an optocoupler 15), the first safety unit 5 and the second safety unit 6 are coupled to one another for the purpose of data exchange via a communication channel 7. A point-to-point data link between the two safety units 5 and 6 is optionally provided.

A respective setpoint value for the phase voltages u1, u2, u3 is transmitted from the control unit 3 via the communication channel 7 to the power unit 4. Measurement values relating to the measured phase currents i1, i2, i3 are transmitted from the power unit 4 via the communication channel 7 to the control unit 3.

The safety units 5, 6 are each designed to evaluate, independently of one another, the setpoint value or values for the phase voltages u1, u2, u3 transmitted via the communication channel 7 and the measurement values relating to the measured phase currents i1, i2, i3 transmitted via the communication channel 7 in order to determine a fault state.

For this purpose, the safety units 5, 6 each ascertain a voltage rotating field depending on the phase voltages u1, u2, u3 generated or to be generated. The safety units 5, 6 also each ascertain a current rotating field depending on the measured phase currents i1, i2 , i3 and each calculate a phase difference between the voltage rotating field and the current rotating field and/or calculate a frequency difference between the frequency of the voltage rotating field and the frequency of the current rotating field. The safety units 5, 6 each determine a fault state when the phase difference exceeds a phase difference threshold value and/or when the frequency difference exceeds a frequency difference threshold value.

If a fault state has been determined in at least one of the safety units 5, 6, they carry out fault handling independently of one another by virtue of the safe torque off (STO) circuit 11 being signaled to bring about an STO state by way of suitable driving of the inverter 8.

The safety units 5, 6 can be arranged on a safety printed circuit board 16. The control unit 3 can accordingly be arranged on a control printed circuit board 17. The power unit 4 can finally be arranged on a power printed circuit board 18.

The invention claimed is:

1. A frequency converter, comprising:
a control unit;
a power unit; and
at least one safety unit, wherein
the frequency converter is operatively configured to:
generate phase voltages for corresponding phase sections of the electric motor based on setpoint values for the phase voltages;
determine a voltage rotating field;
measure occurring phase currents;
determine a current rotating field depending on the measured phase currents;
calculate a phase difference between the voltage rotating field and the current rotating field; and
determine a fault state when the phase difference exceeds a phase difference threshold value, and
wherein the control unit, the power unit and the at least one safety unit are coupled to one another for purposes of data exchange via a communication channel,
wherein the setpoint values for the phase voltages are transmitted from the control unit via the communication channel to the power unit,
wherein measurement values relating to measured phase currents are transmitted from the power unit via the communication channel to the control unit, and
wherein the at least one safety unit is designed to evaluate the respective setpoint values for the phase voltages transmitted via the communication channel and the measurement values relating to the measured phase currents transmitted via the communication channel in order to determine the fault state.

2. The frequency converter according to claim 1, wherein the control unit is configured to regulate the phase currents.

3. The frequency converter according to claim 2, wherein the control unit is configured to use the phase voltages as manipulated variables for regulation of the phase currents.

* * * * *